United States Patent [19]

Amir

[11] 4,214,312

[45] Jul. 22, 1980

[54] VMOS FIELD ALIGNED DYNAMIC RAM CELL

[75] Inventor: Gideon D. Amir, San Jose, Calif.

[73] Assignee: American Microsystems, Inc., Santa Clara, Calif.

[21] Appl. No.: 1,712

[22] Filed: Jan. 8, 1979

[51] Int. Cl.$^2$ .................. G11C 11/40; G11C 11/24
[52] U.S. Cl. ........................... 365/182; 357/55; 365/149
[58] Field of Search .............. 365/149, 182; 357/55

[56] References Cited

U.S. PATENT DOCUMENTS 4,003,036  1/1977  Jenne ................................ 365/182

OTHER PUBLICATIONS

Altman, Preview of ISSCC Excites Designers, Electronics, 12/75, pp. 50-51.

Primary Examiner—Stuart N. Hecker
Attorney, Agent, or Firm—Owen, Wickersham & Erickson

[57] ABSTRACT

A semiconductor memory core structure comprised of an array of cells each having a single IGFET device formed in a recess located on one side of a diffused bit line and directly above a buried storage capacitor. The diffused bit line forms one source or drain region while the buried storage capacitor forms the other source and drain region. With the channel and gate between the two source and drain regions located on only one sidewall of the recess, the gate to drain and bit line capacitance is reduced, thereby providing increased signal power and a higher signal level to a sense amplifier than heretofore available.

5 Claims, 2 Drawing Figures

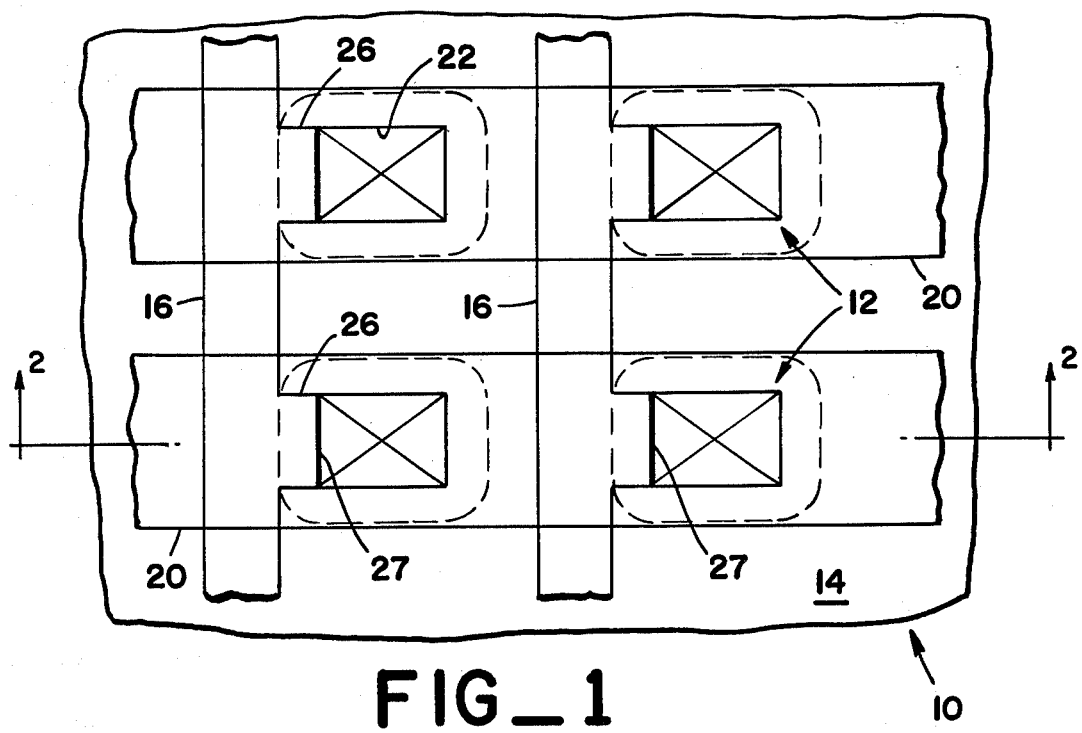
FIG_1
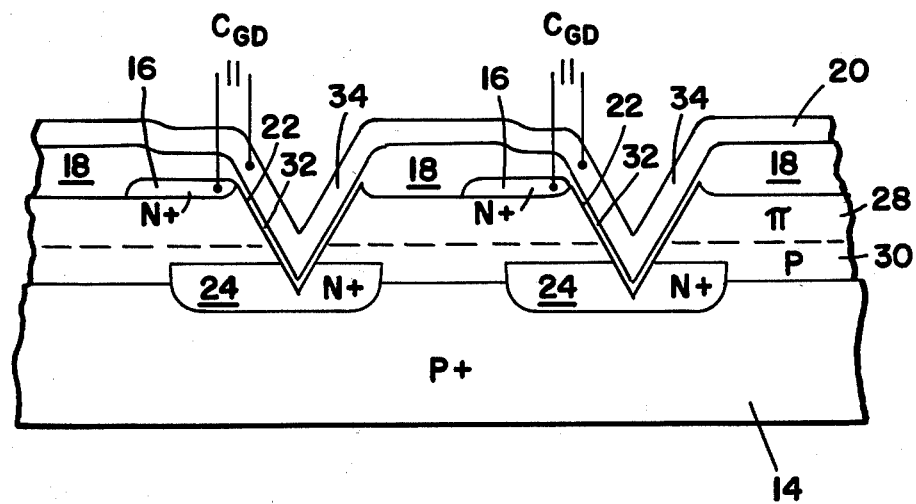
FIG_2

VMOS FIELD ALIGNED DYNAMIC RAM CELL

BACKGROUND OF THE INVENTION

This invention relates to integrated circuit semiconductor devices and more particularly to an improved memory device comprised of an array of single IGFET cells.

In the U.S. Pat. No. 4,003,036, which has the same assignee as this application, a semiconductor memory device having an array of cells is described wherein each cell is comprised of a buried storage capacitor located directly below a diffused line of opposite conductivity material from that of the substrate. A V-shaped recess formed in the surface of the device extends through the diffused line region into a buried storage capacitor region of the same conductivity. The walls of this recess form channel and gate areas interconnecting the line regions with the buried storage capacitor regions directly below. In a preferred embodiment, the diffused line regions served as bit lines and drain regions while transverse word lines were interconnected between the gates of adjacent cells. One disadvantage with the aforesaid structural arrangement was that a relatively large amount of gate-to-drain capacitance was created by the overlap of the gate regions on all walls of each recess with the diffused bit lines. This caused a relatively high overall bit line capacity which reduced the signal power capability of the buried storage capacitor for each cell. The present invention provides a solution to this problem.

SUMMARY OF THE INVENTION

In accordance with the present invention, a semiconductor memory device is comprised of an array of cells each forming a single IGFET element in conjunction with a bit line and a word line of the device. The bit lines are elongated diffused lines of material having an opposite conductivity to that of the device substrate and these bit lines form a drain region for each memory cell. The source region for each single IGFET cell is buried within the substrate at a level below the bit lines and is offset vertically from its bit line. Each cell is preferably formed by an etched recess having a V-shaped cross-section and provided with a thin gate oxide layer on at least one sloping side wall that extends between a bit line region and a buried source region. Thus, the gate region area which overlaps the bit line is relatively small and has a proportionately lesser amount of capacitance than if the bit line was directly above the buried source and the recess extended through the bit line into the source region. Accordingly, with less bit line capacitance, the signal power per element is increased over the prior art structure, thereby providing several advantages in a memory structure.

In summary, one object of the present invention is to provide an improved semiconductor memory structure which provides a greater signal power for a given storage capacitance than heretofore available.

Another object of the invention is to provide a semiconductor memory structure that will produce a higher signal level to a sense amplifier.

Another object of the invention is to provide a semiconductor memory structure that can be readily fabricated with ease and economy using known semiconductor fabrication techniques.

Another object of the present invention is to provide a method for making a semiconductor memory structure wherein diffused parallel bit lines are offset vertically from associated spaced-apart and buried source regions and a V-shaped recess extending into each source region extends through only one side of a bit line.

Other objects, advantages and features of the invention will become apparent from the following detailed description presented with the accompanying drawing.

BRIEF DESCRIPTION OF THE DRAWING

FIG. 1 is a plan view of a portion of a semiconductor showing four memory cells according to the present invention;

FIG. 2 is a view in section taken along the line 2—2 of FIG. 1.

DETAILED DESCRIPTION OF THE EMBODIMENT

With reference to drawing, FIG. 1 shows a portion of a memory core for semiconductor device 10 embodying the principles of the present invention. Such a memory core comprises a preselected number of memory cells 12 which are arranged in a closely-packed orderly array on a semiconductor substrate 14. Each of these cells is comprised of a single insulated gate field effect transistor (IGFET) of the MOS (metal-oxide-silicon) type. Extending through the memory core is a series of parallel, spaced-apart diffused bit lines 16 covered by an insulating layer 18 of field oxide. Formed over this oxide layer in a direction perpendicular to the bit lines is a series of parallel, spaced-apart word lines 20. Each MOS transistor is formed within a recess 22 that has a V-shaped cross-section and extends downwardly into a buried source region 24 in the device substrate 14. In accordance with the invention, each V-shaped recess is located to one side of its associated bit line rather than directly in line with it, and consequently, each buried source region 24 is also offset from the closest bit line above. As shown in FIG. 1, each bit line has a series of projecting portions 26 extending from one side, and each such portion forms a drain region which is essentially the same width as, and terminates with, a narrow edge portion 27 along only one side of a recess 22.

The internal structure of the memory cells 12 for the device 10 may be seen in greater detail in cross-section view of FIG. 2. In the N-channel embodiment shown, the substrate 14 is formed from a wafer of P-type crystalline silicon having a uniform thickness (e.g. 250 microns). The basic substrate material is uniformly doped with boron by conventional procedures to become P+ material. Extending over the P+ substrate is an epitaxial layer 28 of lightly doped P material having a thickness of around three microns. Along the interface between the P+ substrate 14 and the epitaxial layer 28 is an intermediate layer 30 of P material that is more heavily doped than the epitaxial layer but less heavily P doped than the P+ substrate.

Each buried source region 24 is an N+ diffusion that extends downwardly into the P+ substrate but also somewhat upwardly into the interface layer. The V-shaped recess 22 for each cell extends into its buried source region to a level that is below that of the interface layer 30. Within each recess its sloping walls are covered with a thin layer 32 of silicon dioxide that provides a gate oxide. Near the upper edge of each recess, its thin oxide is joined with the thicker layer 18 of field oxide that surrounds the recess. Each diffused bit line 16 of N+ material lies to one side of its associated recesses and also under the field oxide layer. A word line 20 of conductive material (e.g. aluminum) extends over the field oxide, into the recess, thereby also forming its gate 34.

In operation, the device 10 is similar to that of the memory device disclosed in the previously-mentioned U.S. Pat. No. 4,003,036. For example, information is stored by addressing selected cells through appropriate driver circuitry connected to the address or word lines. The transistor of a cell is "turned on" when a positive gate voltage ($V_2$) (in the case of an N-channel device) is applied through a word or address line. When a voltage $V_1$ equivalent to a "one" level is applied through a bit line driver circuit (not shown), and thus to the drains 26 of transistors associated with that bit line, the addressed transistor in that bit line is activated to charge its buried storage capacitor 24 to a storage voltage level. The transistor of the cell is then turned off when the gate voltage level is returned to a lower potential. The storage voltage $V_s$ is then trapped and held on the storage capacitor 24. When the device is to be read out, the foregoing storage process is reversed. Thus, a reference voltage is placed on the selected bit line and the selected address line is supplied again with voltage $V_2$ which turns on the transistor of the activated cell. This allows the stored charge to be transferred from the buried capacitor of the cell onto the connected bit line. This changes the voltage level on the bit line from its reference voltage and the change is detected by a suitable sense-amplifier or processing circuitry (not shown) for that bit line.

The structural arrangement for the memory device 10 according to the present invention provides several important advantages which increase the efficiency of its operation just described. Since the bit lines 16 are formed with their integral projecting drain portions they can be narrower for most of their length. Also, with the recess 20 for each V-groove transistor cell 12 located to one side of its associated bit line 16, only one side of the recess is engaged with the diffused bit line. Thus, the gate overlap capacitance formed with the narrow edge portion 27 of the bit line, and indicated schematically as $C_{GD}$ in FIG. 2, is minimized. The aforesaid structural characteristics provide a bit line capacitance which is up to 50% lower than with prior cell arrays where the recess was formed in the middle of a bit line and all four sides of the transistor gate created a much greater gate-to-drain capacitance with the bit line. This lower capacitance provided by the present device results in a greater signal strength for each cell. It is therefore possible with the present invention to construct memory arrays using the offset cells 12 (which may be self aligned) and having twice the number of such cells per bit line as in prior art devices, while maintaining the same signal strength in the bit line. Or, a greater number of cells (but less than twice the number) per bit line with still greater signal strength.

In manufacturing the memory device 10, previously-established semiconductor fabrication techniques may be used, essentially as disclosed, for example, in U.S. Pat. No. 4,105,475, which has the same assignee as the present invention.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. In a semiconductor memory device, including an array of single transistor memory cells comprising:
   A—a substrate of low resistivity semiconductor material of a preselected polarity;
   B—an epitaxial layer on said substrate having the same polarity but a higher resistivity than said substrate;
   C—a series of elongated, parallel and spaced-apart bit line regions situated in and having the opposite polarity of said epitaxial layer;
   D—a layer of insulative material covering said bit line regions;
   E—a plurality of buried capacitor regions located within said substrate below and to one side of each said bit line region and having the same polarity as said bit line regions;
   F—a plurality of recesses having a V-shaped cross section, each having one sloping sidewall located directly adjacent to one side of a said bit line region, each said recess extending downwardly into a said buried capacitor region;
   G—a thin gate dielectric material within each said recess; and
   H—conductive gate means covering said gate dielectric material within each said recess and connected to an elongated word line of conductive material extending to gate means of other cells in the array in a direction generally perpendicular to said bit lines.

2. The semiconductor device as described in claim 1 wherein said substrate has a P-type conductivity and said bit line regions and said buried capacitor regions have an N-type conductivity.

3. The semiconductor device as described in claim 1 wherein said epitaxial layer has a thickness of around 3 microns.

4. The semiconductor device as described in claim 1 wherein each of said bit line regions has projecting portions at spaced apart intervals along one side of the bit line, each said projecting portion having an end portion terminating along one side of a said recess.

5. The semiconductor device as described in claim 4 wherein said gate means of each said cell overlaps said end portion of a said bit line projecting portion to provide a relatively low gate to drain capacitance, each said gate means being integral and in alignment with one said word line extending perpendicular to said bit lines.

* * * * *